US 8,862,953 B2

(12) United States Patent
Gollub et al.

(10) Patent No.: US 8,862,953 B2
(45) Date of Patent: Oct. 14, 2014

(54) MEMORY TESTING WITH SELECTIVE USE OF AN ERROR CORRECTION CODE DECODER

(71) Applicant: International Business Machines Corporation, Armonk, NY (US)

(72) Inventors: Marc A. Gollub, Round Rock, TX (US); Girisankar Paulraj, Tamilnadu (IN); Diyanesh B. Vidyapoornachary, Bangalore (IN); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 13/734,334

(22) Filed: Jan. 4, 2013

(65) Prior Publication Data

US 2014/0195867 A1 Jul. 10, 2014

(51) Int. Cl.
G11C 29/00 (2006.01)
G11C 29/42 (2006.01)
G11C 29/12 (2006.01)
G11C 29/56 (2006.01)

(52) U.S. Cl.
CPC ............... *G11C 29/42* (2013.01); *G11C 29/00* (2013.01); *G11C 29/56* (2013.01); *G11C 29/12* (2013.01)
USPC ............ 714/719; 714/718; 714/723; 365/201

(58) Field of Classification Search
CPC ......... G11C 29/00; G11C 29/12; G11C 29/56
USPC ............................ 714/718, 719, 723; 365/201
See application file for complete search history.

(56) References Cited

U.S. PATENT DOCUMENTS

| 7,308,621 | B2 * | 12/2007 | Adams et al. | 714/718 |
|---|---|---|---|---|
| 7,480,882 | B1 | 1/2009 | Song et al. | |
| 7,930,592 | B2 | 4/2011 | Ouellette et al. | |
| 8,140,936 | B2 | 3/2012 | Gower et al. | |
| 2005/0044467 | A1 * | 2/2005 | Leung et al. | 714/763 |
| 2009/0282305 | A1 * | 11/2009 | Chen et al. | 714/718 |
| 2010/0005366 | A1 * | 1/2010 | Dell et al. | 714/758 |
| 2010/0174955 | A1 * | 7/2010 | Carnevale et al. | 714/718 |
| 2011/0225475 | A1 * | 9/2011 | Kumar et al. | 714/763 |
| 2011/0320872 | A1 | 12/2011 | Bair et al. | |
| 2011/0320914 | A1 | 12/2011 | Alves et al. | |
| 2011/0320918 | A1 | 12/2011 | Alves et al. | |
| 2014/0146624 | A1 * | 5/2014 | Son et al. | 365/200 |

OTHER PUBLICATIONS

Disclosed anonymously. (Apr. 2012). Method and apparatus for memory shmooing. IP.com Prior Art Database. IP.com No. IPCOM000216652D.*

Lu, H., & Li, J. (May 2009). A programmable online/off-line built-in self-test scheme for RAMs with ECC. 2009 IEEE International Symposium on Circuits and Systems, 1997-2000.*

Dailey, J.L., Garrison, B.R., Pulukuri, M.D. et al. (Mar. 2011). Built-in self-test of embedded memory cores in Virtex-5 field programmable gate arrays. 2011 IEEE 43rd Southeastern Symposium on System Theory (SSST), 220-225.

Jin-Fu Li, Transparent-Test Methodologies for Random Access Memories Without/With ECC; IEEE Transactions on Computer-Aided Design of Integrated Circuits and Systems, vol. 26, No. 10, Oct. 2007.

* cited by examiner

*Primary Examiner* — John Trimmings
(74) *Attorney, Agent, or Firm* — Toler Law Group

(57) ABSTRACT

A method includes directing an access of a memory location of a memory device to an error correction code (ECC) decoder in response to receiving a test activation request indicating the memory location. The method also includes writing a test pattern to the memory location and reading a value from the memory location. The method further includes determining whether a fault is detected at the memory location based on a comparison of the test pattern and the value.

20 Claims, 10 Drawing Sheets

MEMORY TESTING WITH SELECTIVE USE OF AN ERROR CORRECTION CODE DECODER

BACKGROUND

The present disclosure relates to memory testing, and more specifically, to memory testing with selective use of an error correction code decoder. Errors in a memory cell of a computing system may be caused by a manufacturing defect, degradation over time, breakage, electrical or magnetic interference, etc. Redundant memory cells may be used to record parity and enable detection of errors. However, parity checking may detect limited types of errors (e.g., single-bit errors), leaving other errors undetected. A suite of test patterns may be developed to detect various types of errors. For example, a first test pattern may include all 0s, a second test pattern may include all 1s, etc. The first test pattern may be written to the memory cell and then a value may be read back from the memory cell. An error in the memory cell may be detected when the value and the first test pattern do not match. When an error is not detected, memory testing may continue by writing the rest of the test patterns in the suite to the memory cell in turn. However, using test patterns may require that the computing system be offline during memory testing.

SUMMARY

According to a particular embodiment, a method includes directing an access of a memory location of a memory device to an error correction code (ECC) decoder in response to receiving a test activation request indicating the memory location. The method also includes writing a test pattern to the memory location and reading a value from the memory location. The method further includes determining whether a fault is detected at the memory location based on a comparison of the test pattern and the value.

In another particular embodiment, a system includes a rank, an error correction code (ECC) decoder, firmware, and a self-test engine. The rank includes a dynamic random-access memory (DRAM). The ECC decoder is configured to detect an error at a memory location of the DRAM and, in response to detecting the error, place a chip mark associated with the DRAM. The firmware is configured to detect the chip mark associated with the DRAM. The firmware is also configured to direct an access of the DRAM to the ECC decoder while the chip mark associated with the DRAM is in place. The firmware is further configured to request a self-test engine to perform a test of the memory location. The self-test engine is configured to write to the rank including writing a test pattern to the memory location. The self-test engine is also configured to read from the rank including reading a value from the memory location. The self-test engine is further configured to determine whether a fault is detected at the memory location based on a comparison of the value and the test pattern.

In yet another particular embodiment, a computer-readable medium stores instructions. The instructions, when executed by a processor, cause the processor to direct an access of the memory location to an error correction code (ECC) decoder in response to receiving a test activation request indicating a memory location. The instructions, when executed by the processor, also cause the processor to write a test pattern to the memory location and read a value from the memory location. The instructions, when executed by the processor, further cause the processor to determine whether a fault is detected at the memory location based on a comparison of the test pattern and the value.

DETAILED DESCRIPTION

Systems and methods of performing memory testing with selective use of an error correction code (ECC) decoder are disclosed. For example, memory testing may selectively use an error correction code (ECC) decoder to direct an access (e.g., a read access or a write access) of user data associated with a memory location to the ECC decoder, while the memory location is being tested by writing test patterns to the memory location. A test pattern may be written to the memory location and compared to a value read from the memory location. A fault may be detected when the test pattern and the value read from the memory location do not match. The chances of detecting a fault may be improved by using several different test patterns designed to detect various kinds of faults (e.g., faults which may not be detectable by using other memory testing algorithms, such as parity checking).

The disclosed techniques may enable runtime memory testing by directing an access (e.g., a read access or a write access) of user data at a memory location to the ECC decoder, while the memory location is being tested by writing test patterns to the memory location. Embodiments of the disclosure may write a test pattern to the memory location and compare the test pattern to a value read from the memory location to determine whether a fault is detected. The chances of detecting a fault may be improved by using several different test patterns designed to detect various kinds of faults (e.g., faults which may not be detectable by using other memory testing algorithms, such as parity checking). Thus, memory testing with a greater probability of detecting a fault during runtime may be achieved while access of the user data at the memory location is handled by the ECC decoder.

Figure 1:
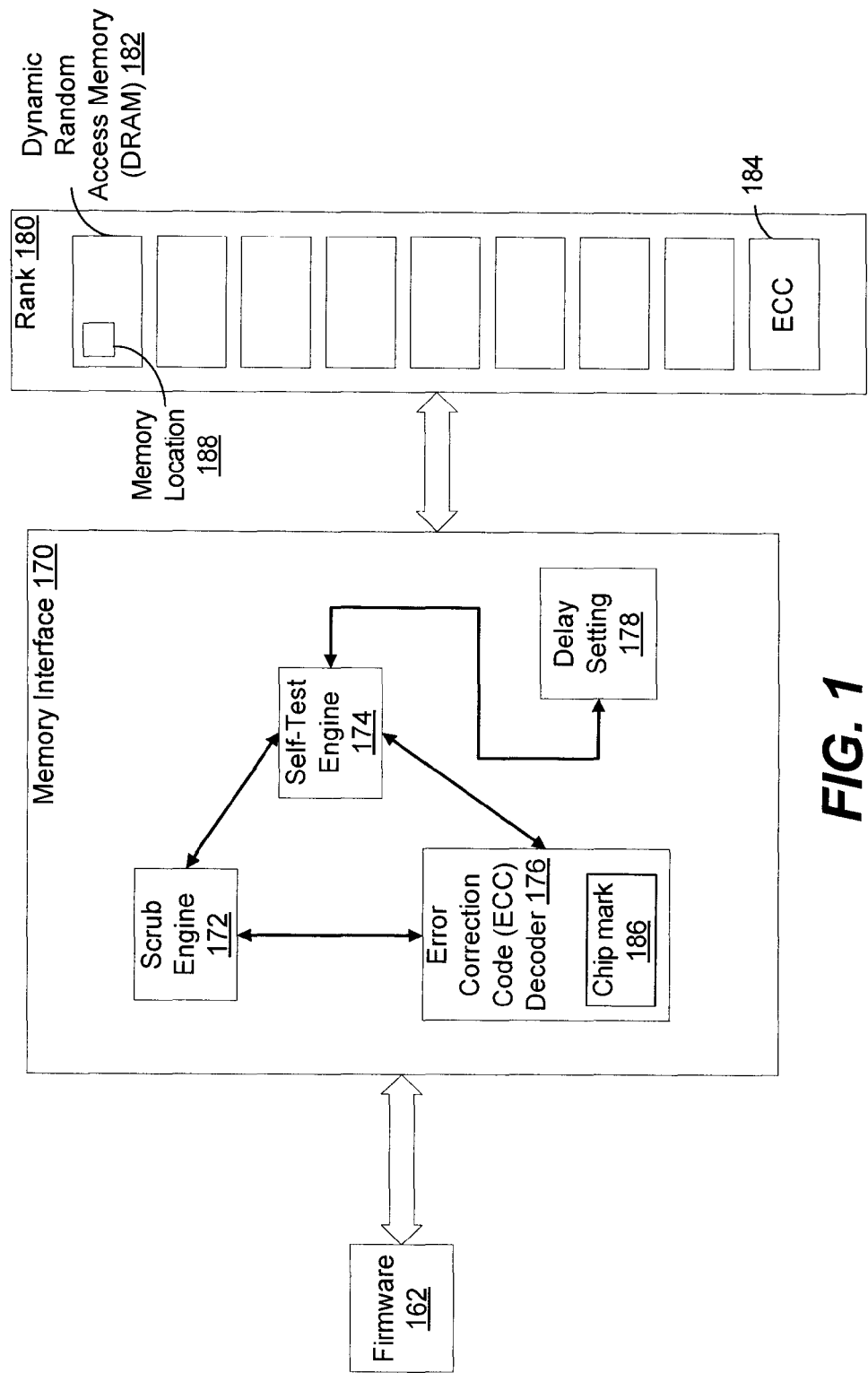
FIG. 1 is a block diagram of exemplary automated computing machinery including an exemplary computer useful in memory testing consistent with a disclosed embodiment.

Turning to the drawings, where like numbers denote like parts throughout the several views, FIG. 1 illustrates one exemplary implementation of a computer that is operable to perform memory testing with selective use of an ECC decoder utilizing one or more test patterns. In FIG. 1, the computer includes firmware 162 coupled to a rank 180 through a memory interface 170. The rank 180 includes a set of dynamic random-access memory (DRAM) chips including a DRAM 182 and one or more error correction code (ECC) 184 modules. Each of the DRAMs may have a different width (e.g., 8-bit, 4-bit, etc.). A rank may have different numbers of DRAMs and ECC modules (e.g., 8 DRAMs and 1 ECC module, 16 DRAMs and 2 ECC modules, etc.). Each of the DRAMs may have a plurality of memory locations, such as illustrative memory location 188. The memory locations may be of various sizes (e.g., a byte, a word, etc.). The DRAMs of a rank, such as the rank 180, may be accessed simultaneously. A single dual in-line memory module (DIMM) may include one or more ranks (e.g., 1, 2, 4, 8, etc.). A random access memory (RAM) may include one or more DIMMs.

The memory interface 170 includes a scrub engine 172, a self-test engine 174, an error correction code (ECC) decoder 176, and a delay setting 178. The self-test engine 174 is coupled to the scrub engine 172, the ECC decoder 176, and the delay setting 178. The scrub engine 172 is also coupled to the ECC decoder 176. In a particular embodiment, the firmware 162 may enable the self-test engine 174 to perform runtime memory testing at the memory location 188. For example, the firmware 162 may receive a test activation request (e.g., from an application, the self-test engine 174, and/or the ECC decoder 176). For example, the ECC decoder 176 may detect an error associated with the memory location 188 (e.g., a bit, a nibble, a byte, a half word, a word, a double word, a block, 1 bit, 4 bits, 8 bits, 16 bits, 32 bits, 64 bits, etc.) and place a chip mark 186 at the ECC decoder 176 (e.g., by setting an error bit at the ECC decoder 176 associated with the DRAM 182, by setting one or more error bits associated with the rank 180, by adding an identifier of the DRAM 182 and/or rank 180 in a mark table that stores chip marks data, etc.). The firmware 162 may detect the chip mark 186. For example, the firmware 162 may detect an error bit associated with the DRAM 182 (or with the rank 180) during a memory access (e.g., during reboot, during a memory test, by an application, by an operating system, etc.). In response to the test activation request, the firmware 162 may direct the self-test engine 174 to perform memory testing. While the memory testing is in progress, the firmware 162 may direct an access of user data at the memory location 188 to the ECC decoder 176. For example, the self-test engine 174 may write a test pattern (e.g., all 1's) to the memory location 188 and read a value from the memory location 188. The self-test engine 174 may determine whether a fault is detected at the memory location 188 based on a comparison of the test pattern and the value. The self-test engine 174 may also update the delay setting 178 for the DRAM 182 based on an upper delay margin determination and a lower delay margin determination, as further described in reference to FIGS. 4-6.

During operation, the firmware 162 may receive a test activation request. For example, the test activation request may be a request to perform memory diagnostics, an error indication based on an error detected by the ECC decoder 176, etc. The test activation request may indicate or identify the memory location 188, the DRAM 182, the rank 180, a DIMM associated with the rank 180, a random access memory (RAM) associated with the DIMM, or any combination thereof. In a particular embodiment, the ECC decoder 176 may detect an error at the memory location 188 and place a chip mark 186 associated with the DRAM 182. In another particular embodiment, the ECC decoder 176 may place the chip mark 186 in response to the firmware 162 receiving the request to perform memory diagnostics. A chip mark associated with each of the DRAMs in the rank 180 may be placed in turn as the memory diagnostics are performed. The chip mark 186 may cause the firmware 162 to direct an access of the memory location 188 and/or of the DRAM 182 to the ECC decoder 176. For example, the firmware 162 may steer writes (e.g., mainline writes, writes initiated by the scrub engine 172, etc.) away from the DRAM 182 by providing a write multiplexer with a first value in response to detecting the chip mark 186, such as by providing an address of the memory location 188 (and/or the DRAM 182), an address of the ECC decoder 176 (or of a parity location on the ECC module 184 or an address of the ECC module 184), and a control value (e.g., 1) to the write multiplexer in response to detecting the chip mark 186. One or more accesses of the memory location 188 and/or the DRAM 182 may be directed to the ECC decoder 176 while the chip mark 186 is in place. For example, the write multiplexer may direct a write access of the memory location 188 (e.g., a mainline write) to the ECC decoder 176 (or to the parity location on the ECC module 184) when the control value indicates a particular value (e.g., 1). Thus, access of user data associated with the memory location 188 and/or the DRAM 182 may be enabled via the ECC decoder 176 while the memory location 188 and/or the DRAM 182 undergoes memory testing. For example, the firmware 162 may provide the write multiplexer with the first value before starting memory testing of the memory location 188, so that write accesses of the memory location 188 during memory testing are directed to the ECC decoder 176 (or to the parity location).

The firmware 162 may also direct the self-test engine 174 to perform memory diagnostics on the DRAM 182, including writing a test pattern to the memory location 188, reading a value from the memory location 188, and determining whether a fault is detected based on a comparison of the test pattern and the value. In a particular embodiment, the firmware 162 may direct the self-test engine 174 to perform memory diagnostics periodically, as part of memory maintenance and/or in response to detection of a memory error. Writing the test pattern to the memory location 188 may include writing to the rank 180 and reading the value from the memory location 188 may include reading from the rank 180. For example, the firmware 162 may direct the self-test engine 174 to perform an atomic read-modify-write of the rank 180 to write the test pattern to the memory location 188. The atomic read-modify-write may be interleaved with mainline traffic (e.g., memory accesses initiated by an application, an operating system, and/or a hypervisor). The self-test engine 174 may write multiple test patterns in turn to the memory location 188 and perform a comparison after each write with a value read from the memory location. The test patterns may be designed to check for different kinds of faults. For example, each of the test patterns may be generated based on a testing algorithm (e.g., zero-one, checkerboard, galloping (GALPAT), walking $\frac{1}{10}$, sliding diagonal, butterfly, march, etc.). The test pattern may be "00000000", "11111111", "01010101", "10101010", "11001100", etc. When the self-test engine 174 detects a fault, the chip-mark 186 associated with the DRAM 182 may be maintained at the ECC decoder 176, another memory location may be used instead of the memory location 188, another DRAM may be used instead of the DRAM 182, a warning regarding the DRAM 182 may be generated, or any combination thereof. For example, the firmware 162 may leave the chip-mark 186 in place at the ECC decoder 176, use another memory location that is available instead of the memory location 188, use a spare DRAM instead of the DRAM 182, generate a warning to a hypervisor or to an operating system, or any combination thereof. The warning may indicate that the memory location 188 and/or the DRAM 182 is at risk of producing an error. In response to the warning, the hypervisor and/or the operating system may move data away from the memory location 188 and/or the DRAM 182 to another memory location (e.g., on a spare DRAM). For example, data may be copied from the memory location 188 (or the DRAM 182) to another memory location (e.g., on the spare DRAM) that is unused and page table entries may be updated to reflect the move to the other memory location, so that future accesses to the data will be directed to the other memory location instead of to the memory location 188.

When a fault is not detected, the user data may be restored to the memory location 188, the chip-mark 186 may be removed from the ECC decoder 176, or any combination thereof. For example, the firmware 162 may direct the scrub engine 172 to perform an atomic read-modify-write of the rank 180 to restore the user data to the DRAM 182. The user data that is restored to the DRAM 182 may have been updated by a write access during the memory testing and/or corrected by the ECC decoder 176. For example, the scrub engine 172 may write data from the parity location on the ECC module 184 to the memory location 188. The data at the parity location may have been updated by the write access that was directed to the parity location by the write multiplexer. The firmware 162 may remove the chip-mark 186 from the ECC decoder 176 and direct subsequent accesses (e.g., read access, write access, etc.) to the memory location 188 to the DRAM 182 instead of to the ECC decoder 176. For example, the firmware 162 may steer writes (e.g., mainline writes, writes initiated by the scrub engine 172, etc.) to the DRAM 182 by providing the write multiplexer with a second value. For example, the firmware 162 may provide the write multiplexer with a second control value (e.g., 0) so that subsequent writes to the memory location 188 are directed to the memory location 188 and not to the ECC decoder 176 (or the parity location).

Alternatively, when a fault is not detected, the firmware 162 may perform a shmoo of the DRAM 182. That is, the firmware 162 may update the delay setting 178 for the DRAM 182 based on a determined upper delay margin and a determined lower delay margin and/or detect that a difference between the upper delay margin and the lower delay margin is below a threshold. For example, the firmware 162 may direct the self-test engine 174 to determine an upper delay margin and a lower delay margin. The delay setting 178 may have an initial value. The self-test engine 174 may determine an upper delay margin by incrementing the delay setting 178 by an increment value and determining whether the fault is detected. The self-test engine 174 may repeatedly increment the delay setting 178 and perform the determination until a fault is detected. The upper delay margin may thus represent an upper boundary of the delay setting 178 at which a fault is detected. Similarly, the self-test engine 174 may determine a lower delay margin by decrementing the delay setting 178 by a decrement value and determining whether a fault is detected. The self-test engine 174 may repeatedly decrement the delay setting 178 until a fault is detected. The lower delay margin may thus represent a lower boundary of the delay setting 178 at which a fault is detected. The self-test engine 174 may reset the delay setting 178 to the initial value after determining the upper delay margin and before determining the lower delay margin, or vice versa. The self-test engine 174 may determine the lower delay margin before determining the upper delay margin, or vice versa.

The firmware 162 may calculate a middle value that is between the lower delay margin and the upper delay margin (e.g., approximately half of a difference between the upper delay margin and the lower delay margin) and update the delay setting 178 to be the middle value. The firmware 162 may also determine whether the middle value is "too close" to the upper and/or lower delay margins. For example, the firmware 162 may determine whether a difference between the upper delay margin and the middle value is below a threshold value.

When the firmware 162 detects that the difference is below the threshold (i.e., the middle value is "too close"), the chip-mark 186 may be maintained at the ECC decoder 176, another DRAM may be used instead of the DRAM 182, a warning regarding the DRAM 182 may be generated, or any combination thereof. For example, the firmware 162 may leave the chip-mark 186 in place on the ECC decoder 176 of FIG. 1, use a spare DRAM instead of the DRAM 182, generate a warning to a hypervisor or to an operating system, or any combination thereof. The warning may indicate that the memory location 188 and/or the DRAM 182 is at risk of producing an error. In response to the warning, the hypervisor and/or the operating system may move data away from the memory location 188 and/or the DRAM 182.

When the firmware 162 detects that the difference is above or equal to the threshold, the user data may be restored to the memory location 188, the chip-mark 186 may be removed, or any combination thereof. For example, the firmware 162 may direct the scrub engine 172 to perform an atomic read-modify-write of the rank 180 to restore the user data to the DRAM 182. The user data that is restored to the DRAM 182 may have been updated by a write access during the memory testing and/or corrected by the ECC decoder 176. For example, the firmware 162 may have provided a multiplexer a first value to direct accesses (e.g., from an application) of the DRAM 182 to the ECC module 184 before starting the shmoo of the DRAM 182. The firmware 162 may have provided the multiplexer with an address of the DRAM 182, an address of the ECC module 184, and a control value (e.g., 1). The multiplexer may have directed a write access of the memory location 188 on the DRAM 182 to the ECC module 184 while the shmoo was in progress and the write access may have updated a parity location on the ECC module 184. The scrub engine 172 may perform an atomic read-modify-write of the rank 180 to restore the user data from the ECC module 184 to the DRAM 182. The firmware 162 may remove the chip-mark 186 and direct subsequent accesses to the memory location 188 to the DRAM 182 instead of to the ECC decoder 176. For example, the firmware 162 may provide the multiplexer with a second value (e.g., a control value of 0) so that subsequent accesses to the DRAM 182 are directed to the DRAM 182 instead of to the ECC decoder 176. Having concluded testing of the DRAM 182, the firmware 162 may direct the self-test engine 174 to perform memory diagnostics of a next DRAM.

Thus, FIG. 1 illustrates a particular embodiment of memory testing with selective use of an ECC decoder utilizing one or more test patterns, which may be designed to detect various faults. This may enable memory testing during runtime with an increased likelihood of detecting faults in comparison to detecting errors using other memory testing algorithms such as parity checking. Moreover, timing margins associated with a DRAM may drift over time (e.g., due to thermal degradation). DRAM-width shmooing may be performed as part of a periodic memory health check and delay settings of the DRAMs may be updated and/or preventive measures may be taken when a DRAM with narrow delay margins is detected, such as replacing the DRAM with another DRAM or moving the data on the DRAM to a spare DRAM. This may reduce the likelihood of encountering a fault on a subsequent access to the memory.

Figure 2:
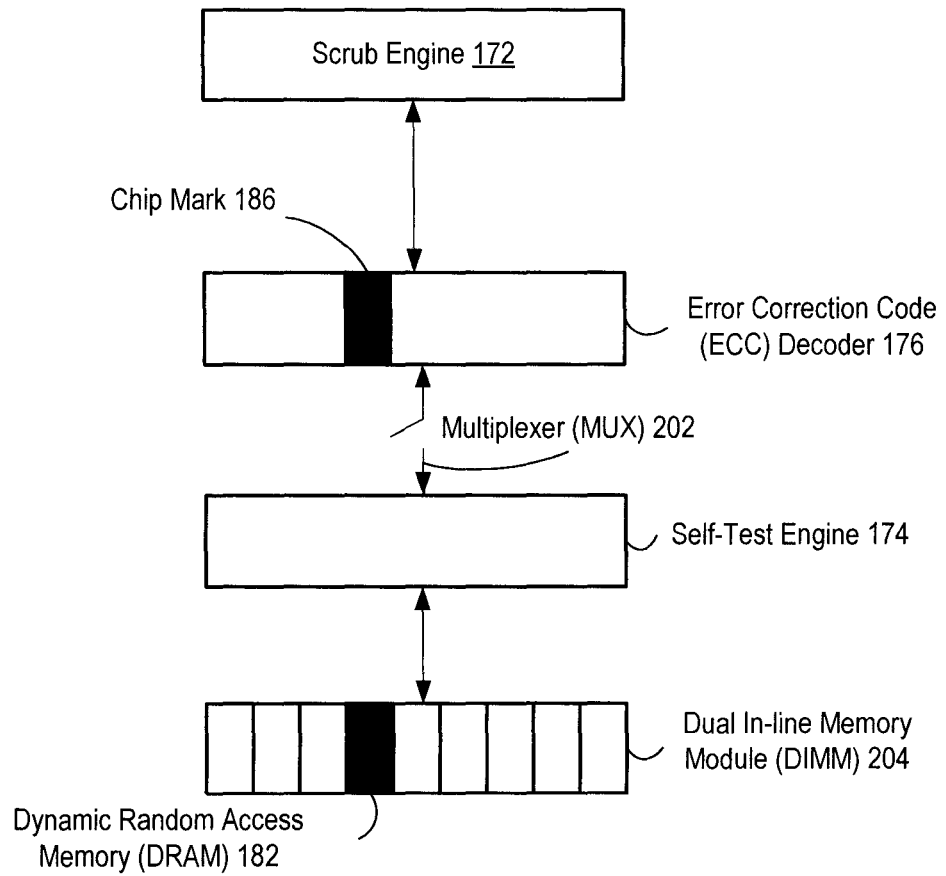
FIG. 2 is a block diagram illustrating in greater detail an exemplary implementation of the computer of FIG. 1.

FIG. 2 illustrates a particular embodiment of the computer of FIG. 1. FIG. 2 illustrates that an access by the scrub engine 172 may be directed to the ECC decoder 176 while the chip mark 186 is in place. A multiplexer (MUX) 202 may disable an access by the ECC decoder 176 to the DRAM 182 included in a DIMM 204. On the other hand, the self-test engine 174 may be enabled to access the DRAM 182 even while the chip mark 186 is in place.

Figure 3:
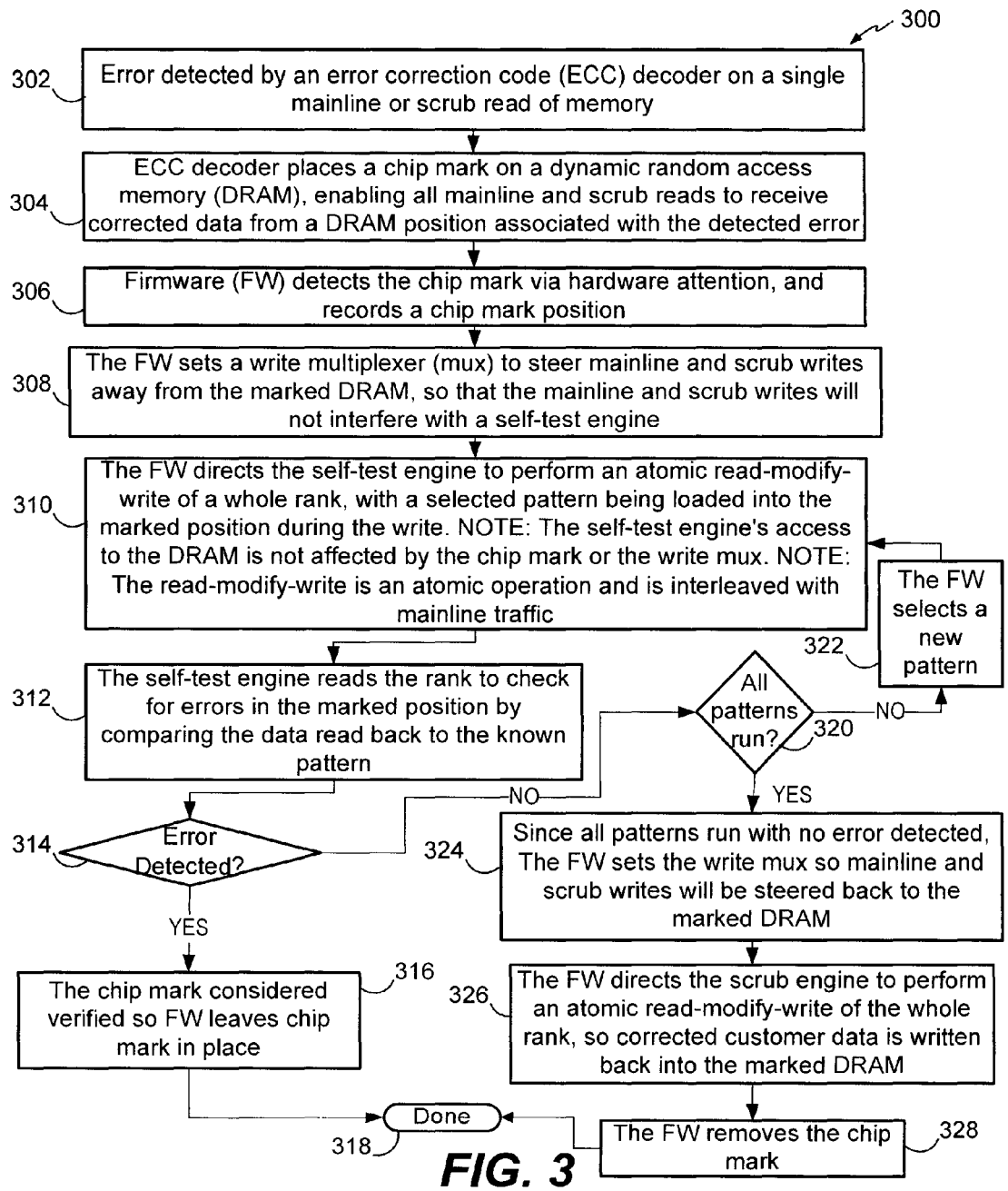
FIG. 3 is a flow chart illustrating a first exemplary sequence of operations performed by the computer of FIG. 1 to implement memory testing.

FIG. 3 illustrates a particular embodiment of a method 300 outlining a sequence of operations performed by the computer of FIG. 1 to implement memory testing. In an illustrative embodiment, the method 300 may be described with reference to FIGS. 1-2.

The method 300 may include an error correction code (ECC) decoder detecting an error on a single mainline or scrub read of memory, at 302, and placing a chip mark on a dynamic random access memory (DRAM) enabling all mainline and scrub reads to receive corrected data from a DRAM position associated with the detected error, at 304. For example, in FIG. 1, the ECC decoder 176 may detect an error associated with the memory location 188 of the DRAM 182 and place the chip mark 186 associated with the memory location 188. The chip mark 186 may indicate that a mainline or a scrub read access of the memory location 188 is to be directed to the ECC decoder 176.

The method 300 may also include firmware detecting the chip mark via hardware attention and recording a chip mark position, at 306. For example, in FIG. 1, the firmware 162 may detect the chip mark 186 via hardware attention and may record a chip mark position.

The method 300 may further include the firmware setting a write multiplexer (mux) to steer mainline and scrub writes away from the marked DRAM, so that the mainline and scrub writes will not interfere with a self-test engine, at 308. For example, in FIG. 1, the firmware 162 may set a write multiplexer (e.g., the MUX 202 of FIG. 2) to direct mainline and scrub writes away from the DRAM 182 associated with the memory location 188, as described with reference to FIGS. 1-2.

The method 300 may also include the firmware directing the self-test engine to perform an atomic read-modify-write of a whole rank, with a selected pattern being loaded into the marked position during the write, at 310. For example, in FIG. 1, the firmware 162 may direct the self-test engine 174 to perform an atomic read-modify-write operation of the rank 180. To illustrate, the self-test engine 174 may read data from each DRAM of the rank 180 during the atomic read-modify-write operation. The self-test engine 174 may modify the read data by writing a test pattern over the data associated with the memory location 188 and may write the modified data to the rank 180. The self-test engine's access to the DRAM is not affected by the chip mark or by the write mux, as described with reference to FIG. 2. The read-modify-write is an atomic operation and is interleaved with mainline traffic.

The method 300 may further include the self-test engine reading the rank to check for errors in the marked position by comparing the data read back to the known pattern, at 312. For example, in FIG. 1, the self-test engine 174 may perform a read operation of the rank 180 and compare a value read from the memory location 188 to the test pattern.

The method 300 may further include determining whether an error is detected based on the comparison of the data and the known pattern, at 314. For example, in FIG. 1, the self-test engine 174 may determine whether an error is detected at the memory location 188 based on the comparison of the value read from the memory location 188 to the test pattern.

The method 300 may also include the firmware considering the chip mark verified and leaving the chip mark in place in response to determining that an error is detected, at 316. For example, in FIG. 1, the firmware 162 may consider that the chip mark 186 is verified in response to the self-test engine 174 determining that an error is detected. The firmware 162 may leave the chip mark 186 in place. The method 300 may end, at 318.

Alternatively, the method 300 may further include determining whether all patterns have been run in response to determining that an error is not detected, at 320. For example, in FIG. 1, the firmware 162 may determine whether all test patterns have been executed in response to determining that an error associated with the memory location 188 is not detected.

The method 300 may also include the firmware selecting a new pattern in response to determining that all patterns have not been run, at 322, and returning to 310. For example, in FIG. 1, the firmware 162 may select a second test pattern in response to determining that all test patterns have not been executed.

When all patterns have been run, the method 300 may further include the firmware setting the write mux so that mainline and scrub writes will be steered back to the marked DRAM since all patterns have been run with no error detected, at 324. For example, in FIG. 1, the firmware 162 may set the write mux (e.g., the MUX 202 of FIG. 2) to direct mainline and scrub writes to the DRAM 182.

The method 300 may also include the firmware directing the scrub engine to perform an atomic read-modify-write of the whole rank so that corrected customer data is written back into the marked DRAM, at 326. For example, in FIG. 1, the firmware 162 may direct the scrub engine 172 to perform an atomic read-modify-write of rank 180. The read access may receive data associated with the memory location 188 from the ECC decoder 176. The ECC decoder 176 may provide corrected data associated with the memory location 188 based on parity bits. The scrub engine 172 may write data including the data received from the ECC decoder 176 back to rank 180. The corrected data may be written back to the memory location 188.

The method 300 may further include the firmware removing the chip mark, at 328. For example, in FIG. 1, the firmware 162 may remove the chip mark 186 associated with the memory location 188. The method 300 may end, at 318.

Figure 4:
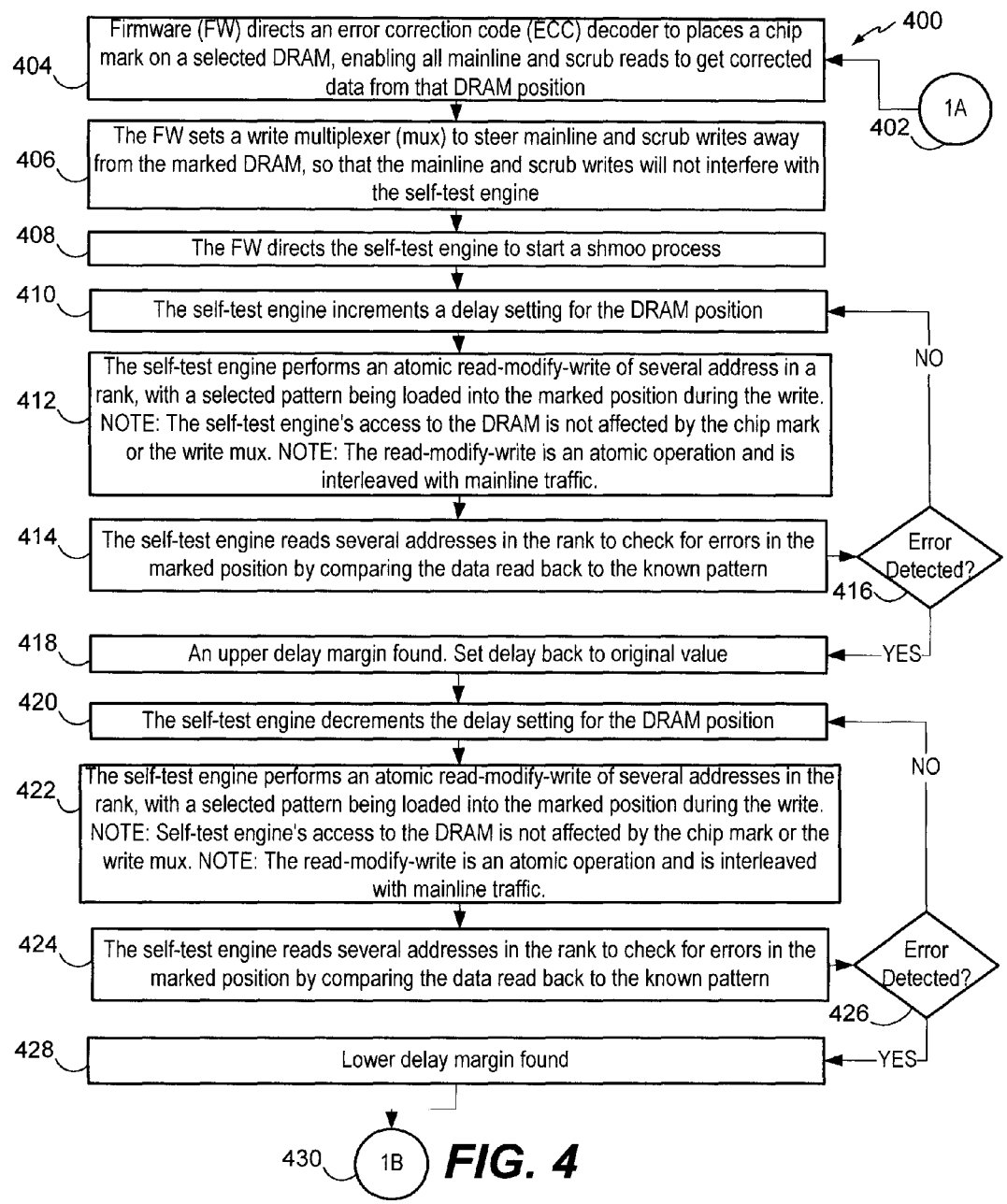
FIG. 4 is a flow chart illustrating a second exemplary sequence of operations performed by the computer of FIG. 1 to implement memory testing.
Figure 5:
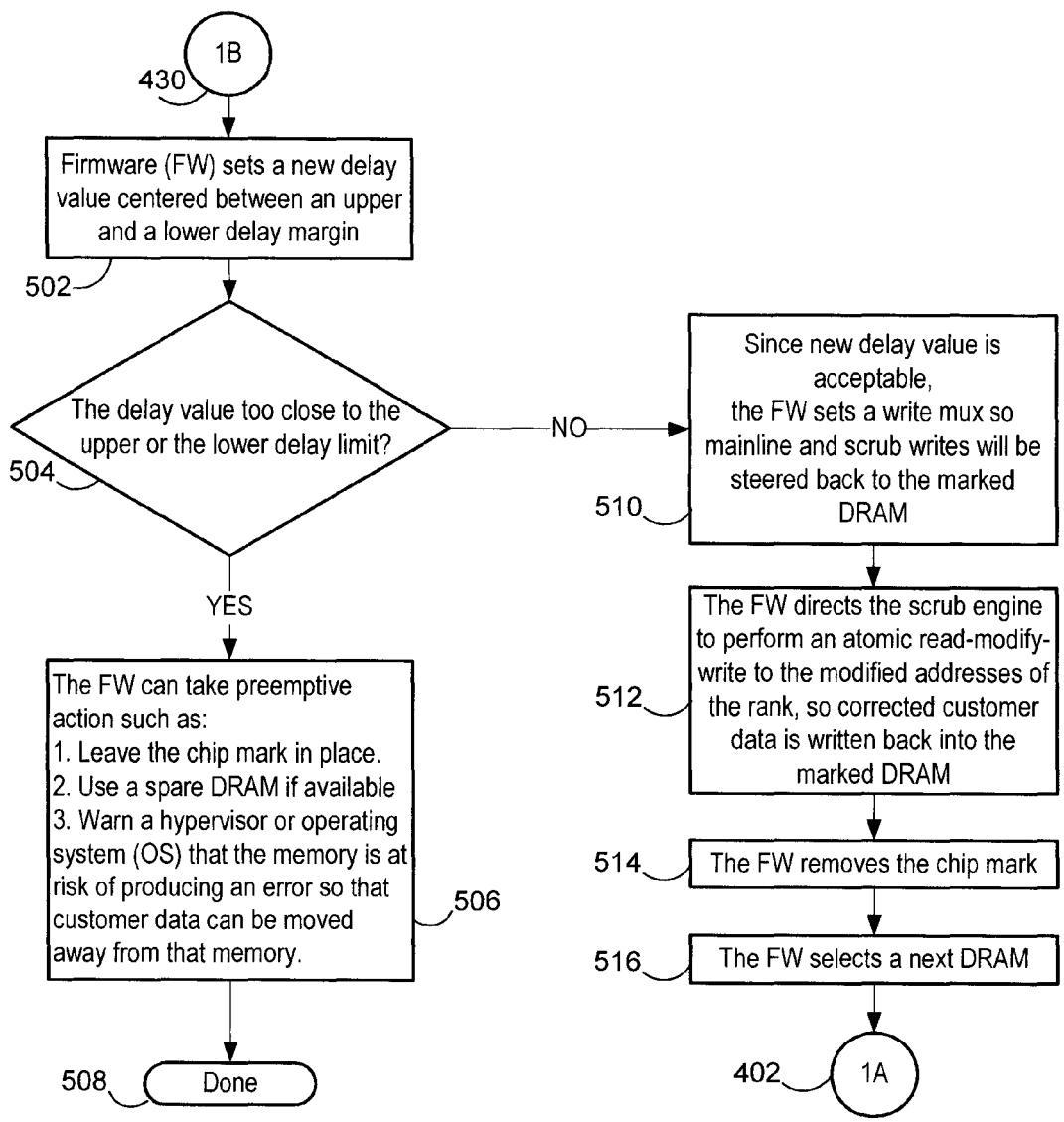
FIG. 5 is a flow chart illustrating a third exemplary sequence of operations performed by the computer of FIG. 1 to implement memory testing.

FIGS. 4-5 represent a particular embodiment of a method 400 outlining a sequence of operations performed by the computer of FIG. 1 to implement memory testing.

Because the method 400 is divided across multiple FIGS. 4 and 5, linking circles 1A 402 and 1B 430 are used for continuity and illustration. The method 400 may include firmware (FW) directing an error correction code (ECC) decoder to place a chip mark on a selected DRAM, at 404. The chip mark enables all mainline and scrub reads to get corrected data from that DRAM position. For example, in FIG. 1, the firmware 162 may direct the ECC decoder 176 to place the chip mark 186 associated with DRAM 182 so that all mainline and scrub read accesses of the memory location 188 receive corrected data associated with the memory location 188 from the ECC decoder 176.

The method 400 may further include the firmware setting a write multiplexer (mux) to steer mainline and scrub writes away from the marked DRAM, so that the mainline and scrub writes will not interfere with the self-test engine, at 406. For example, in FIG. 1, the firmware 162 may set a write mux (e.g., the MUX 202 of FIG. 2) to direct mainline and scrub writes away from the DRAM 182 so that the self-test engine 174 may read and write to the memory location 188 without the data at the memory location 188 being overwritten by other accesses.

The method 400 may also include the firmware directing the self-test engine to start a shmoo process, at 408, and the self-test engine incrementing a delay setting for the DRAM position, at 410. For example, in FIG. 1, the firmware 162 may direct the self-test engine 174 to start a shmoo process. The shmoo process may include updating the delay setting 178 for the DRAM 182 based on a determined upper delay margin and a determined lower delay margin. The upper delay margin may be determined by incrementing the delay setting 178, writing a test pattern to the memory location 188, and reading a value from the memory location 188, until a particular iteration when the value read from the memory location 188 does not match the test pattern. The upper delay margin may be the delay setting 178 of the particular iteration. Similarly, the lower delay margin may be determined by decrementing the delay setting 178, writing a test pattern to the memory location 188, and reading a value from the memory location 188, until a particular iteration when the value read from the memory location 188 does not match the test pattern. The self-test engine 174 may begin the shmoo process by incrementing the delay setting 178 associated with the memory location 188.

The method 400 may also include the self-test engine performing an atomic read-modify-write of several addresses in the rank, with a selected pattern being loaded into the marked position during the write, at 412. For example, in FIG. 1, the self-test engine 174 may perform an atomic read-modify-write operation on several addresses of the rank 180. The write operation may include writing a selected test pattern to the memory location 188. The self-test engine's access to the DRAM is not affected by the chip mark or the write mux, as described with reference to FIG. 2. The read modify-write is an atomic operation and is interleaved with mainline traffic.

The method 400 may further include the self-test engine reading several addresses in the rank to check for errors in the marked position by comparing the data read back to the known pattern, at 414. For example, in FIG. 1, the self-test engine 174 may read several addresses of the rank 180 and compare a value read from the memory location 188 to the test pattern.

The method 400 may also include determining whether an error is detected based on the comparison of the data read back to the known pattern, at 416. For example, in FIG. 1, the self-test engine 174 may determine whether an error is detected at the memory location 188 based on the comparison of the value read from the memory location 188 to the test pattern. If an error is not detected, the method 400 may return to 410.

Alternatively, the method 400 may further include determining that an upper delay margin is found in response to determining that an error is detected and setting the delay back to an original value, at 418. For example, in FIG. 1, the firmware 162 may determine an upper delay margin based on determining that an error is detected. The firmware 162 may set the delay setting 178 to an original value.

The method 400 may also include the self-test engine decrementing the delay setting for the DRAM position, at 420. For example, in FIG. 1, the self-test engine 174 may decrement the delay setting 178 associated with the memory location 188.

The method 400 may further include the self-test engine performing an atomic read-modify-write of several addresses in the rank, with a selected pattern being loaded into the marked position during the write, at 422. For example, in FIG. 1, the self-test engine 174 may perform an atomic read-modify-write operation of several addresses of the rank 180. The write operation may include writing a test pattern to the memory location 188. The self-test engine's access to the DRAM is not affected by the chip mark or the write mux, as described with reference to FIG. 2. The read-modify-write is an atomic operation and is interleaved with mainline traffic.

The method 400 may also include the self-test engine reading several addresses in the rank to check for errors in the marked position by comparing the data read back to the known pattern, at 424. For example, in FIG. 1, the self-test engine 174 may read several addresses of the rank 180 and compare a value read from the memory location 188 to the test pattern.

The method 400 may further include determining whether an error is detected based on the comparison of the value read from the memory location 188 to the test pattern, at 426. For example, in FIG. 1, the self-test engine 174 may determine whether an error is detected based on the comparison of the value read from the memory location 188 to the test pattern. If an error is not detected, the method 400 may return to 420.

The method 400 may further include determining that a lower delay margin is found based on determining that an error is detected, at 428. For example, in FIG. 1, the firmware 162 may determine a lower delay margin based on determining that an error is detected.

Advancing to FIG. 5, the method 400 may also include firmware setting a new delay value centered between an upper and a lower margin, at 502. For example, in FIG. 1, the firmware 162 may set the delay setting 178 associated with the memory location 188 to a value in the middle of an upper delay margin and a lower delay margin.

The method 400 may further include determining whether the delay value is too close to the upper or the lower delay limit, at 504. For example, in FIG. 1, the firmware 162 may determine whether a first difference between the upper delay margin and the lower delay margin is below a threshold.

The method 400 may also include the firmware taking preemptive action in response to determining that the delay value is too close to the upper or the lower delay limit, at 506. The preemptive action may include leaving the chip mark in place, using a spare DRAM if available, warning a hypervisor or an operating system that the memory is at risk of producing an error so that customer data can be moved away from that memory, or a combination thereof. For example, in FIG. 1, the firmware 162 may take one or more actions in response to determining that the difference between the upper delay margin and the lower delay margin is below the threshold. An action of the firmware 162 may include leaving the chip mark 186 in place, using a spare DRAM instead of the DRAM 182, generate a warning to a hypervisor or an operating system related to the delay setting 178, or a combination thereof. The method 400 may end at 508.

Alternatively, the method 400 may further include the firmware setting the write mux so that mainline and scrub writes will be steered back to the marked DRAM in response to determining that the delay value is not too close to the upper or lower delay limit (i.e., is acceptable), at 510. For example, in FIG. 1, the firmware 162 may set the write mux (e.g., MUX 202 of FIG. 2) to direct mainline and scrub writes associated with the memory location 188 back to the DRAM 182 in response to determining that the difference between the upper delay margin and the lower delay margin was above the threshold.

The method 400 may also include the firmware directing the scrub engine to perform an atomic read-modify-write to the modified addresses of the rank, so corrected customer data is written back into the marked DRAM, at 512. For example, in FIG. 1, the firmware 162 may direct the scrub engine 172 to perform an atomic read-modify-write operation to the memory location 188 of the rank 180. The read operation may receive corrected data associated with the memory location 188 from the ECC decoder 176 because the chip mark 186 may be in place. The write operation may write the corrected data to the memory location 188 since the write mux is set to direct scrub writes to the memory location 188.

The method 400 may further include the firmware removing the chip mark, at 514, selecting a next DRAM, at 516, and continuing to step 402 of FIG. 4. For example, in FIG. 1, the firmware 162 may remove the chip mark 186 and select a next DRAM.

Figure 6:
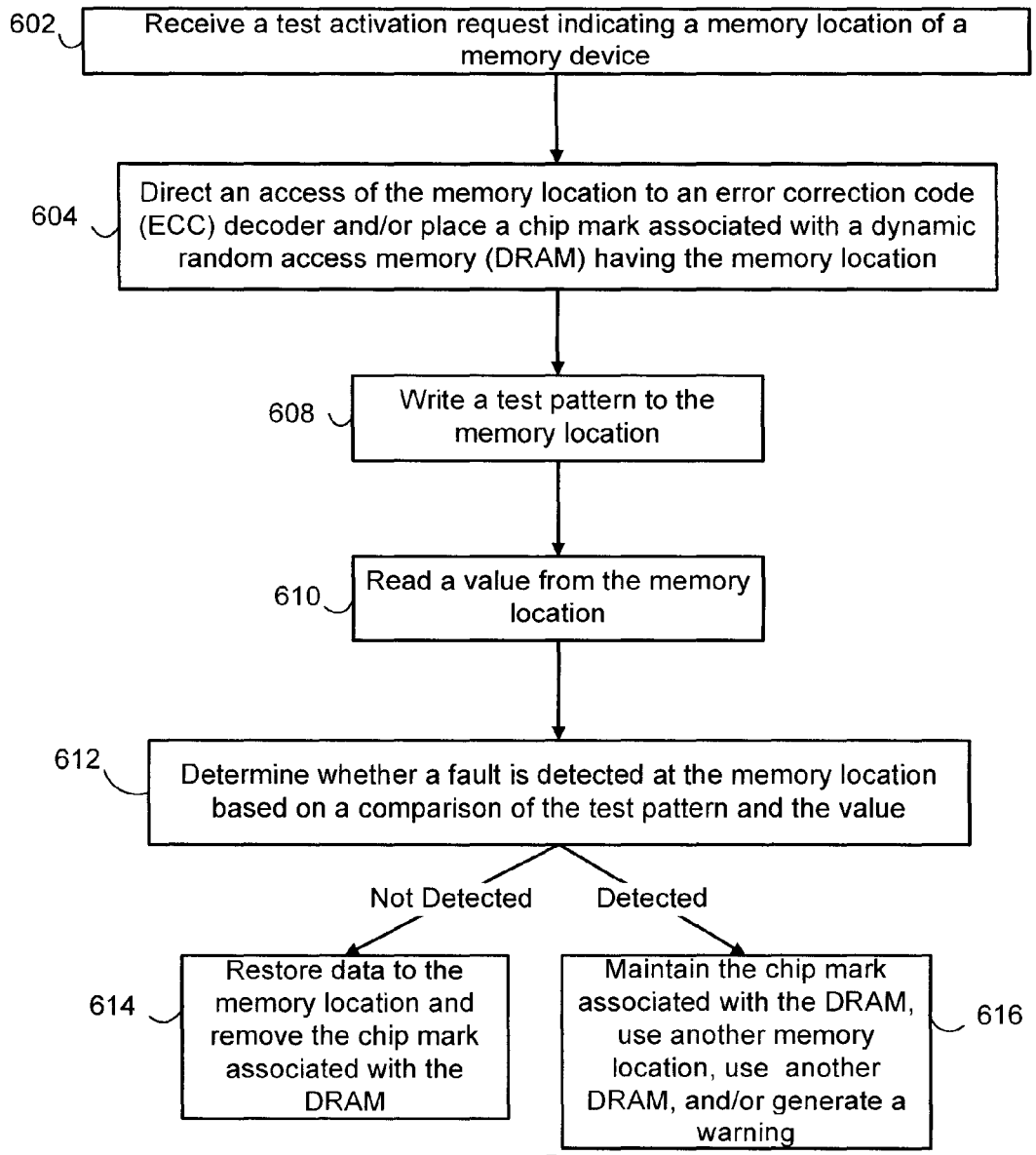
FIG. 6 is a flow chart illustrating a fourth exemplary sequence of operations performed by the computer of FIG. 1 to implement memory testing.

FIG. 6 illustrates a particular embodiment of a method 600 outlining a sequence of operations performed by the computer of FIG. 1 to implement memory testing. In an illustrative embodiment, the method 600 may be described with reference to FIGS. 1-2.

The method 600 may include receiving a test activation request indicating a memory location of a memory device, at 602. For example, referring to FIG. 1, the firmware 162 may receive a test activation request indicating the memory location 188. The test activation request may include an error indication (e.g., detection of the chip mark 186 placed by the ECC decoder 176 upon detecting an error), a request by the self-test engine 174 (e.g., as part of periodic memory testing), a request received from an application (e.g., user-initiated memory testing), or a request received from an operating system.

Continuing to 604, an access of the memory location is directed to an error correction code (ECC) decoder and/or a chip mark associated with a dynamic random access memory (DRAM) including the memory location is placed. For example, referring to FIG. 1, the firmware 162 may direct a read access or a write access of the memory location 188 to the ECC decoder 176. The firmware 162 may provide a first value to a multiplexer before starting memory testing, such as by providing the multiplexer with an address of the memory location, an address the ECC decoder 176, and a control value (e.g., 1). When there is an access of the memory location (e.g., a read access by an application), the multiplexer will direct the access to the ECC decoder 176. The firmware 162 may also direct the ECC decoder 176 to place a chip mark 186 associated with the DRAM 182 (e.g., by setting an error bit associated with the DRAM 182 and/or by setting an error bit associated with the rank 180).

Advancing to 608, a test pattern is written to the memory location, at 608, and a value is read from the memory location, at 610. For example, referring to FIG. 1, the firmware 162 may direct the self-test engine 174 to perform memory diagnostics on the DRAM 182. The self-test engine 174 may write a test pattern to the memory location 188 and read a value from the memory location 188.

Continuing to 612, a determination is made whether a fault is detected at the memory location based on a comparison of the test pattern and the value. For example, referring to FIG. 1, the self-test engine 174 may compare the test pattern and the value read from the memory location 188 to determine whether a fault is detected at the memory location 188.

When a fault is not detected, data is restored to the memory location and the chip mark associated with the DRAM is removed, at 614. For example, referring to FIG. 1, the firmware 162 may direct the scrub engine 172 to restore data to the memory location 188 and the firmware 162 may remove the chip mark 186 from the ECC decoder 176.

When a fault is detected, a chip mark associated with the DRAM is maintained, another memory location is used instead of the memory location, another DRAM is used instead of the DRAM, and/or a warning regarding the DRAM is generated, at 616. For example, referring to FIG. 1, the firmware 162 may leave the chip-mark 186 associated with the DRAM 182 in place, use another memory location that is available instead of the memory location 188, use a spare DRAM instead of the DRAM 182, and/or generate a warning regarding the DRAM 182.

Figure 7:
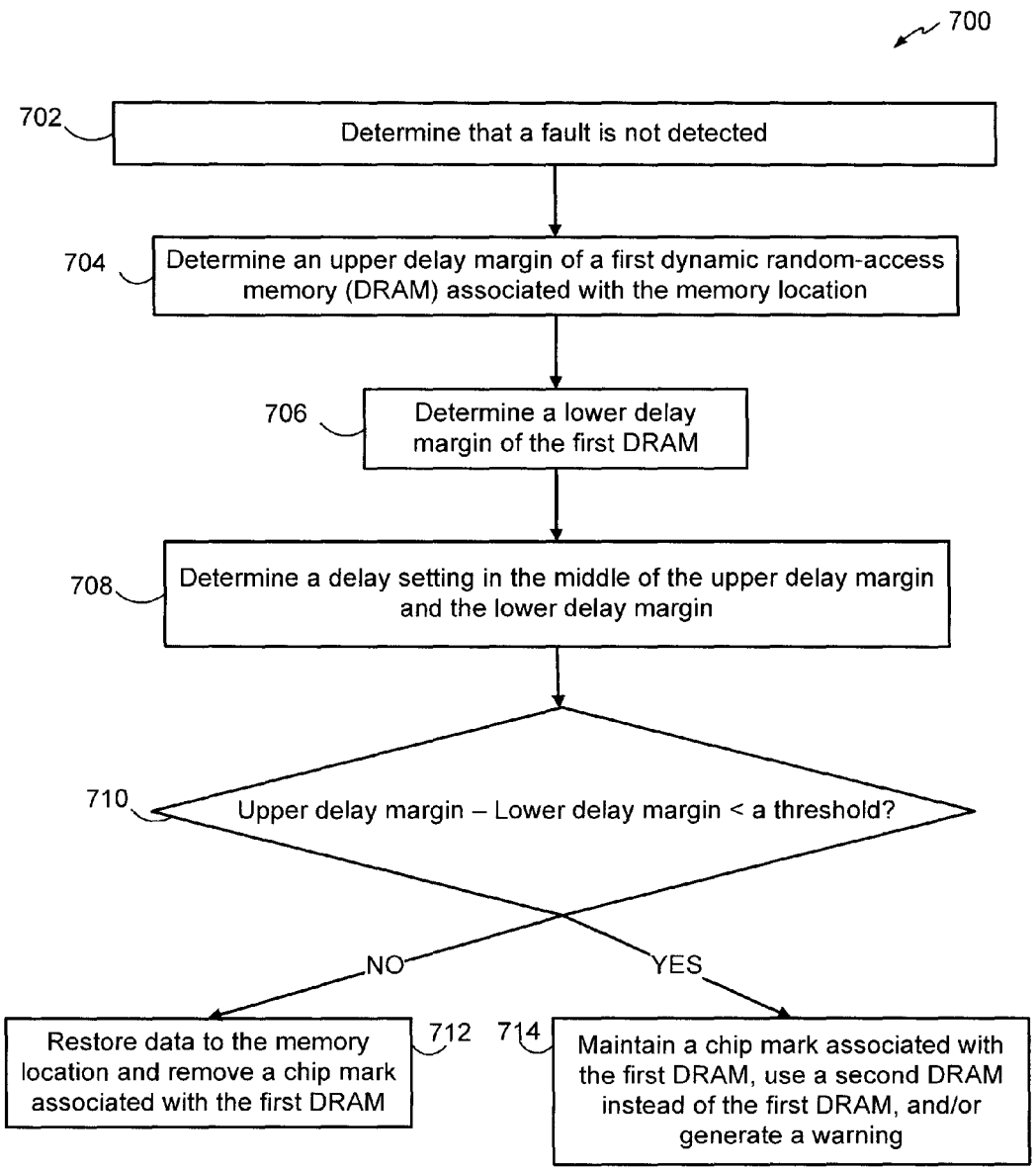
FIG. 7 is a flow chart illustrating a fifth exemplary sequence of operations performed by the computer of FIG. 1 to implement memory testing.

FIG. 7 illustrates a particular embodiment of a method 700 outlining a sequence of operations performed by the computer of FIG. 1 to implement memory testing. In an illustrative embodiment, the method 700 may be described with reference to FIG. 1.

With this sequence of operations, when a determination is made that a fault is not detected, at 702, an upper delay margin of a first dynamic random-access memory (DRAM) associated with the memory location is determined, at 704, and a lower delay margin of the first DRAM is determined, at 706. For example, referring to FIG. 1, the self-test engine 174 may determine an upper delay margin and a lower delay margin in response to determining that a fault is not detected at the memory location 188. In a particular embodiment, the upper and lower delay margins may be determined by incrementing and decrementing the delay setting 178 respectively until a fault is detected, as further described with reference to FIGS. 4-5.

Continuing to 708, a delay setting in the middle of the upper delay margin and the lower delay margin is determined. For example, referring to FIG. 1, the firmware 162 may direct the self-test engine 174 to determine a delay setting 178 in the middle of the upper delay margin and the lower delay margin. A determination is made whether a difference between the upper delay margin and the lower delay margin is lower than a threshold, at 710. For example, referring to FIG. 1, the self-test engine 174 may determine whether a difference between the upper delay margin and the delay setting is lower than a threshold.

When the difference is not lower than the threshold, data is restored to the memory location and a chip mark associated with the first DRAM is removed, at 712. For example, referring to FIG. 1, the firmware 162 may direct the scrub engine 172 to restore data to the memory location 188 when the self-test engine 174 determines that the difference is not lower than the threshold and the firmware 162 may direct the ECC decoder 176 to remove the chip mark 186 associated with the DRAM 182.

When the difference is lower than the threshold, a chip mark associated with the first DRAM is maintained, a second DRAM is used instead of the first DRAM, and/or a warning regarding the first DRAM is generated, at 714. For example, referring to FIG. 1, the firmware 162 may leave the chip-mark 186 associated with the DRAM 182 in place, use a spare DRAM instead of the DRAM 182, and/or generate a warning regarding the DRAM 182.

Figure 8:
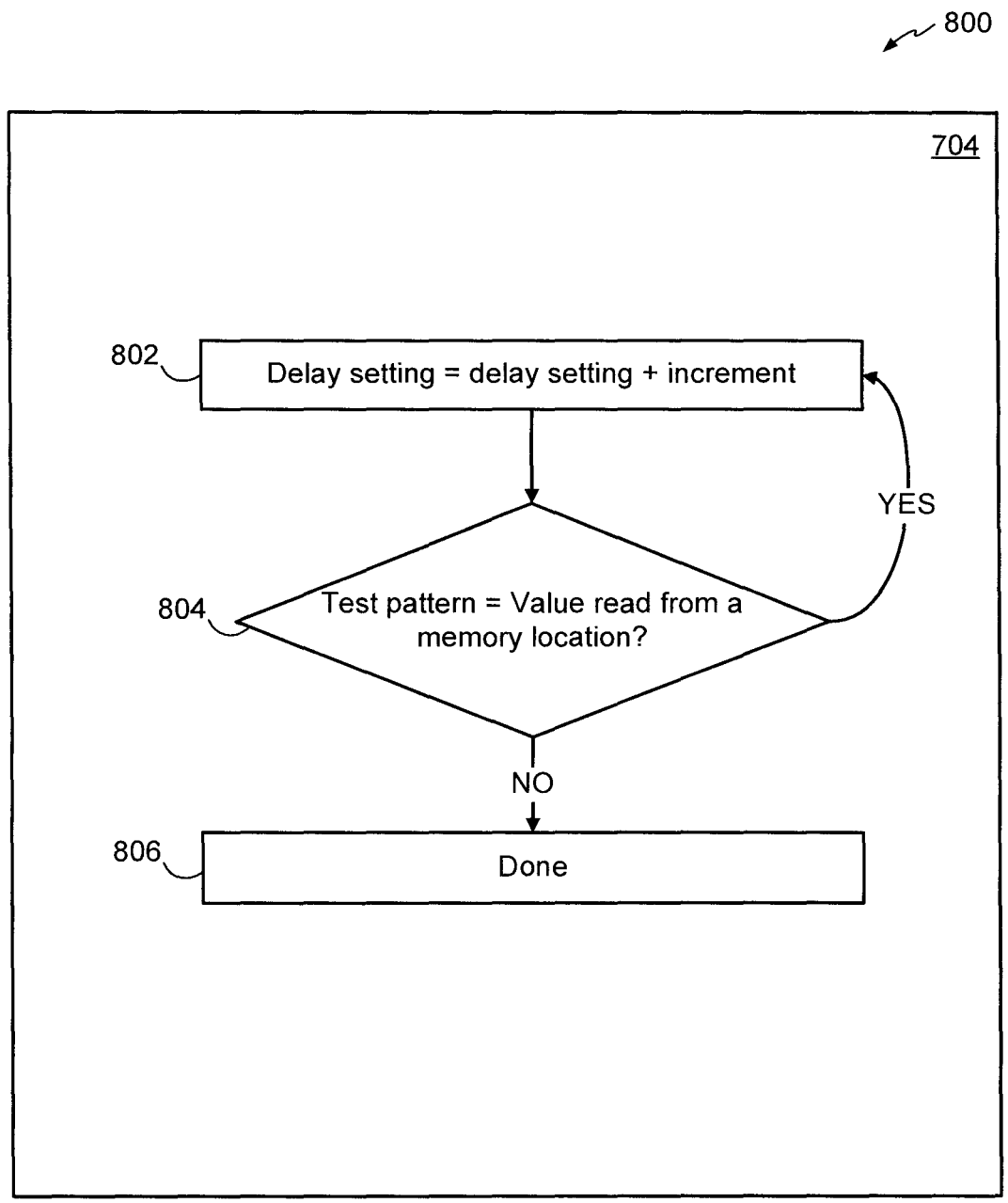
FIG. 8 is a flow chart illustrating a sixth exemplary sequence of operations performed by the computer of FIG. 1 to implement memory testing.

FIG. 8 illustrates a particular embodiment of a method 800 outlining a sequence of operations performed by the computer of FIG. 1 to implement memory testing. For example, the method 800 may correspond to operation 704 of FIG. 7.

With this sequence of operations, a delay setting is incremented, at 802, and a determination is made whether a value read from a memory location matches a test pattern, at 804. For example, referring to FIG. 1, the self-test engine 174 may increment the delay setting 178 and determine whether a value read from the memory location 188 matches a test pattern. When the value and the test pattern match, the delay setting is incremented again, at 802. For example, referring to FIG. 1, the self-test engine 174 may increment the delay setting 178 again, in response to determining that the value and the test pattern match. When, on the other hand, the value and the test pattern do not match at 804, this sequence of operations ends at 806. Thus, an upper delay margin is determined at which the DRAM 182 may start experiencing memory errors.

Figure 9:
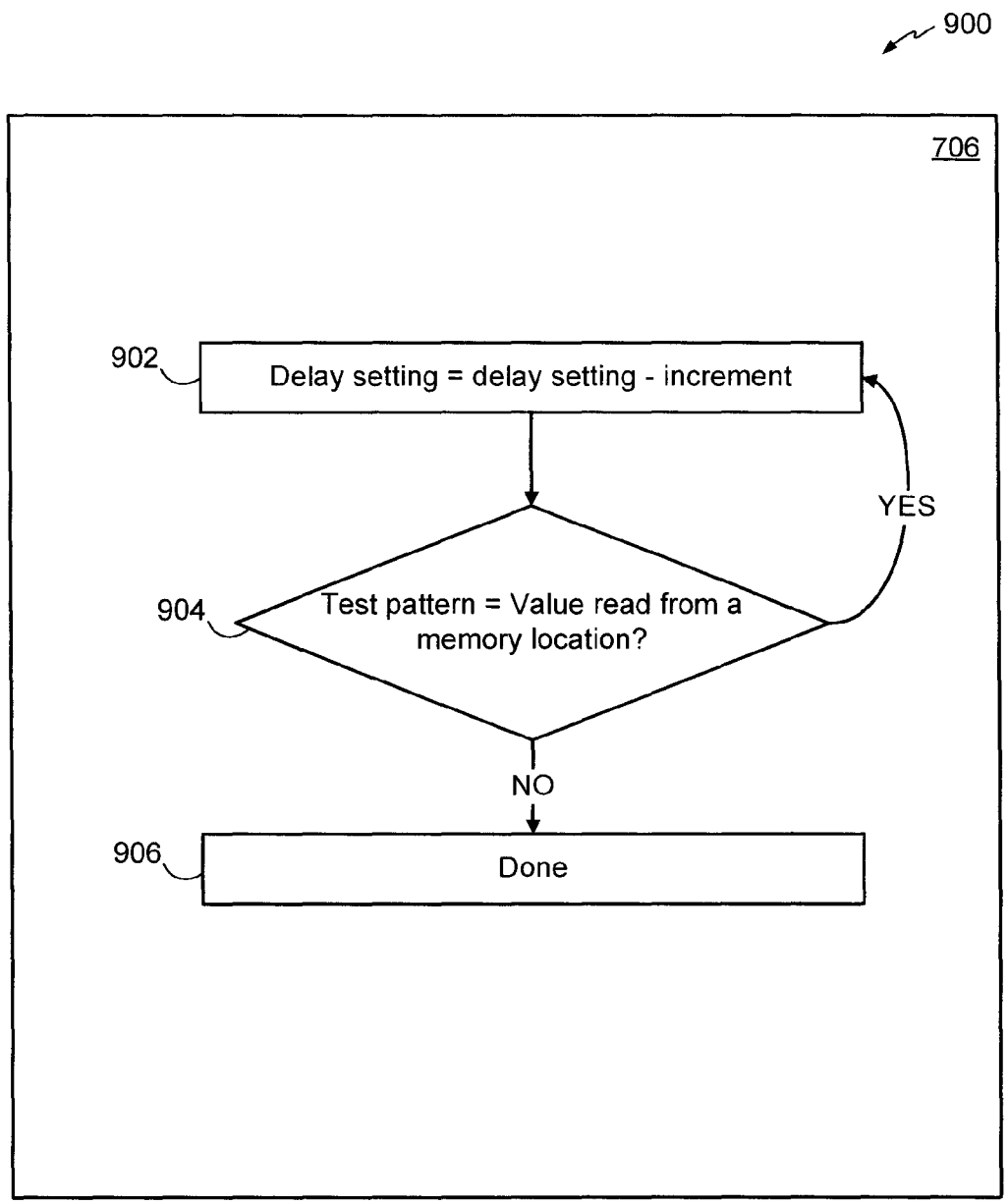
FIG. 9 is a flow chart illustrating a seventh exemplary sequence of operations performed by the computer of FIG. 1 to implement memory testing.

FIG. 9 illustrates a particular embodiment of a method 900 outlining a sequence of operations performed by the computer of FIG. 1 to perform memory testing. For example, the method 900 may correspond to operation 706 of FIG. 7.

With this sequence of operations, a delay setting is decremented, at 902, and a determination is made whether a value read from a memory location matches a test pattern, at 904. For example, referring to FIG. 1, the self-test engine 174 may decrement the delay setting 178 and determine whether a value read from the memory location 188 matches a test pattern. When the value and the test pattern match, the delay setting is decremented again, at 902. For example, referring to FIG. 1, the self-test engine 174 may decrement the delay setting 178 again, in response to determining that the value and the test pattern match. When, on the other hand, the value and the test pattern do not match at 904, this sequence of operations ends at 906. Thus, a lower delay margin is determined at which the DRAM 182 may start experiencing memory errors.

Memory testing with selective use of an ECC decoder utilizing one or more test patterns, which may be designed to detect various faults, may enable memory testing during runtime with an increased likelihood of detecting faults in comparison to detecting errors using other memory testing algorithms such as parity checking. Moreover, timing margins associated with a DRAM may drift over time (e.g., due to thermal degradation). DRAM-width shmooing may be performed as part of a periodic memory health check and delay settings of the DRAMs may be updated and/or preventive measures may be taken when a DRAM with narrow delay margins is detected, such as replacing the DRAM with another DRAM or moving the data of the DRAM to a spare DRAM. The preventive measures may reduce the likelihood of encountering a fault on a subsequent access to the memory.

Figure 10:
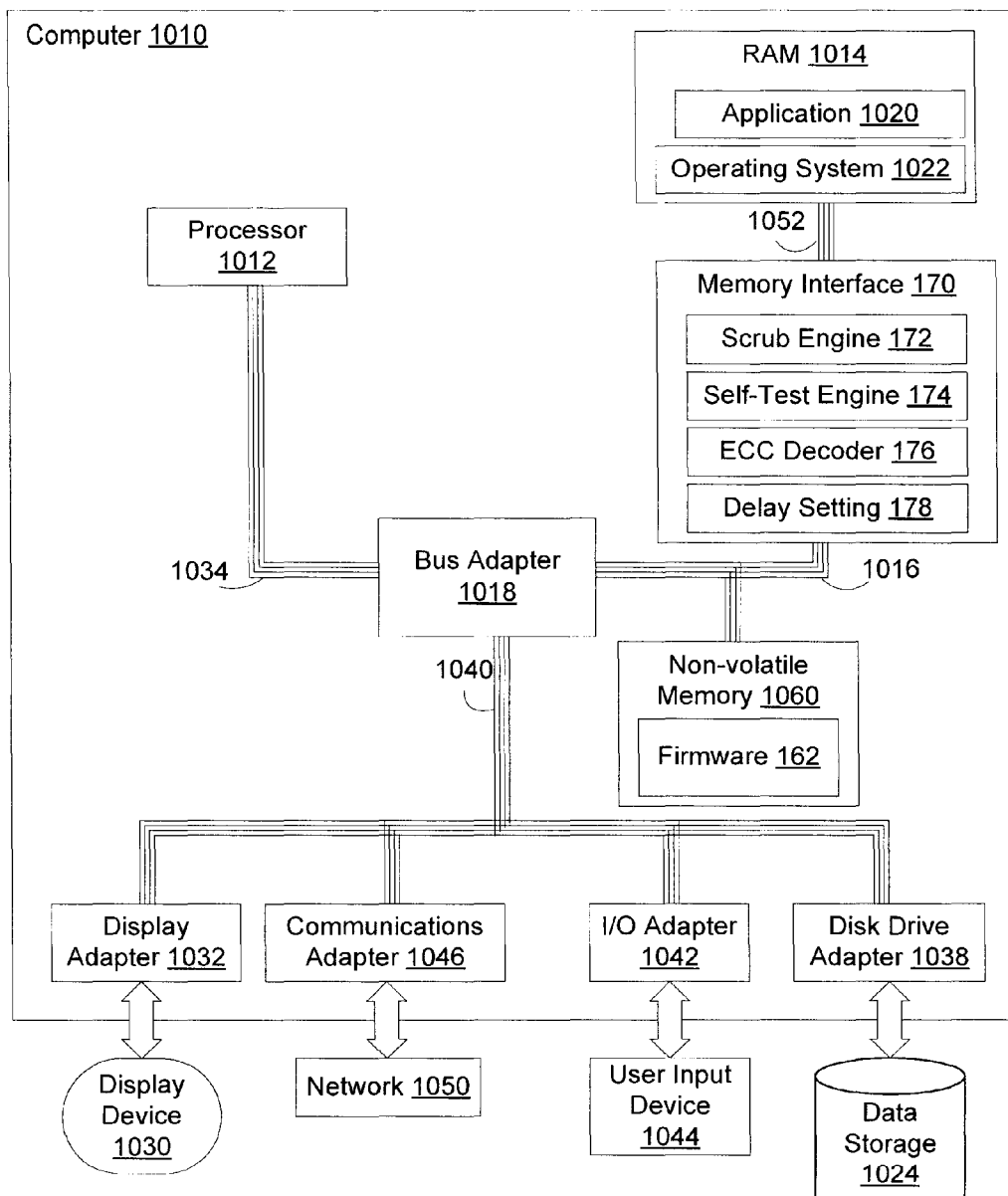
FIG. 10 is a block diagram of an exemplary computer system operable to support embodiments of computer-implemented methods, computer program products, and system components as illustrated in FIGS. 1-5.

FIG. 10 illustrates exemplary automated computing machinery including a computer 1010. The computer 1010 is an exemplary implementation of the computer of FIG. 1. The computer 1010 includes at least one computer processor (CPU) 1012 as well as a random access memory ("RAM") 1014, a memory interface 170, and a non-volatile memory 1060. The RAM 1014 is connected through a high speed memory bus 1052 to the memory interface 170. The memory interface 170 and the non-volatile memory 1060 are connected through a high speed memory bus 1016 and a bus adapter 1018 to the processor 1012 through a processor bus 1034.

The memory interface 170 includes a scrub engine 172, a self-test engine 174, an error correction code (ECC) decoder 176, and a delay setting 178. The non-volatile memory 1060 includes firmware 162. In a particular embodiment, the firmware 162 may enable the self-test engine 174 to perform runtime memory testing at a memory location of the RAM 1014. For example, the firmware 162 may receive a test activation request (e.g., from an application, the self-test engine 174, and/or the ECC decoder 176). In response to the test activation request, the firmware 162 may direct an access of user data at the memory location to the ECC decoder 176 and may direct the self-test engine 174 to perform memory testing, as described with reference to FIG. 1.

Stored in the RAM 1014 is an application 1020, which may be a module of user-level computer program instructions for carrying out particular tasks (e.g., word processing, spreadsheets, database operations, video gaming, stock market simulations, graphics simulations, atomic quantum process simulations, or other user-level applications). Also stored in the RAM 1014 is an operating system 1022. Operating systems useful in connection with disclosed embodiments include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 1022 and the application 1020 in the example of FIG. 10 are shown in RAM 1014, but components of such software may also, or in addition, be stored in non-volatile memory (e.g., on data storage, such as illustrative data storage 1024 and/or the non-volatile memory 1060).

The computer 1010 includes a disk drive adapter 1038 coupled through an expansion bus 1040 and the bus adapter 1018 to the processor 1012 and other components of the computer 1010. The disk drive adapter 1038 connects non-volatile data storage to the computer 1010 in the form of the data storage 1024 and may be implemented, for example, using Integrated Drive Electronics ("IDE") adapters, Small Computer System Interface ("SCSI") adapters, and others as will occur to those of skill in the art. Non-volatile computer memory also may be implemented as an optical disk drive, electrically erasable programmable read-only memory (so-called "EEPROM" or "Flash" memory), RAM drives, and other devices, as will occur to those of skill in the art.

The computer 1010 also includes one or more input/output ("I/O") adapters 1042, which implement user-oriented input/output through, for example, software drivers and computer hardware for controlling input and output to and from user input devices 1044, such as keyboards and mice. In addition, the computer 1010 includes a communications adapter 1046 for data communications with a data communications network 1050. Such data communications may be carried out serially through Recommended Standard 232 (RS-232) connections (sometimes referred to as "serial" connections), through external buses such as a Universal Serial Bus ("USB"), through data communications networks such as internet protocol (IP) data communications networks, and in other ways as will occur to those of skill in the art. The communications adapter 1046 implements the hardware level of data communications through which one computer sends data communications to another computer, directly or through a data communications network. Examples of the communications adapter 1046 suitable for use in the computer 1010 include, but are not limited to, modems for wired dial-up communications, Ethernet (Institute of Electrical and Electronics Engineers (IEEE) 802.3) adapters for wired network communications, and IEEE 802.11 adapters for wireless network communications. The computer 1010 also includes a display adapter 1032 which facilitates data communication between the bus adapter 1018 and a display device 1030, enabling the application 1020 to visually present output on the display device 1030.

In a particular embodiment, the ECC decoder 176 may detect an error associated with a memory location (e.g., a bit, a nibble, a byte, a half word, a word, a double word, a block, 1 bit, 4 bits, 8 bits, 16 bits, 32 bits, 64 bits, etc.) of the rank 180 and place the chip mark 186 associated with the DRAM 182. The firmware 162 may detect the chip mark and direct the self-test engine 174 to perform memory testing of the memory location. The self-test engine 174 may write a test pattern to the memory location and compare the test pattern to a value read from the memory location to determine whether a fault is detected at the memory location. For example, the test pattern may be all 1's. The self-test engine 174 may write all 1's to the memory location and read a value from the memory location. If the value read from the memory location includes any 0's then a fault is detected. Other test patterns may include all 0's, a mix of 1's and 0's, such as alternating 1's and 0's, etc. While the memory testing is in progress, the firmware 162 may direct an access of user data associated with the memory location to the ECC decoder 176. For example, the firmware 162 may provide a multiplexer with a first value before starting memory testing, such as by providing the multiplexer with an address of the memory location, an address of a parity location of an ECC module, and a control value (e.g., 1). When there is an access of the memory location (e.g., a read access by an application), the multiplexer will direct the access to the parity location. Thus, access to the user data associated with the memory location may be enabled even while the self-test engine 174 overwrites the user data at the memory location with one or more test patterns during memory testing.

As will be appreciated by one skilled in the art, aspects of the present disclosure may be embodied as a system, a method, a computer program product, or in other manners. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "logic," "module," or "system." Furthermore, aspects of the present disclosure may take the form of a computer program product embodied in one or more computer readable medium(s) having computer-readable program code embodied thereon.

Any combination of one or more computer readable medium(s) may be utilized. The computer readable medium may be a computer readable signal medium or a computer readable storage medium. A computer readable storage medium may be, for example but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain, or store a program for use by or in connection with an instruction performing system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction performing system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as JAVA (JAVA is a registered trademark of Sun Microsystems), Smalltalk, C++ or the like and conventional procedural programming languages, such as the "C" programming language or similar programming languages. The program code may perform entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which perform via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which perform on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more performable instructions for implementing the specified logical function(s). It should also be noted that, in some alternative implementations, the functions noted in the block may occur out of the order noted in the figures. For example, two blocks shown in succession may, in fact, be performed substantially concurrently, or the blocks may sometimes be performed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. Example embodiments may be performed with or without query processing.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   in response to receiving a test activation request indicating a memory location of
   a memory device:
      directing an access of the memory location to an error correction code (ECC) decoder;
      writing a test pattern to the memory location;
      reading a value from the memory location; and
      determining whether a fault is detected at the memory location based on a comparison of the test pattern and the value.

2. The method of claim 1, wherein the memory location is a byte.

3. The method of claim 1, further comprising restoring data to the memory location in response to determining that the fault is not detected.

4. The method of claim 1, further comprising placing a chip mark associated with a dynamic random-access memory (DRAM) including the memory location in response to receiving the test activation request.

5. The method of claim 4, wherein writing the test pattern comprises writing to a rank, wherein the rank includes the DRAM.

6. The method of claim 4, further comprising removing the chip mark associated with the DRAM in response to determining that the fault is not detected.

7. The method of claim 1, wherein the test activation request includes an error indication.

8. The method of claim 1, wherein the access is a read access or a write access.

9. The method of claim 1, further comprising:
   in response to determining that the fault is not detected:
      determining an upper delay margin of a first dynamic random-access memory (DRAM) associated with the memory location; and
      determining a lower delay margin of the first DRAM.

10. The method of claim 9, wherein determining the upper delay margin comprises successively incrementing a delay setting associated with the first DRAM, writing the test pattern to the memory location, and reading the value from the memory location, until after a particular increment a comparison of the test pattern and the value indicates that the fault is detected.

11. The method of claim 9, wherein determining the lower delay margin comprises successively decrementing a delay setting associated with the first DRAM, writing the test pattern to the memory location, and reading the value from the memory location, until after a particular decrement a comparison of the test pattern and the value indicates that the fault is detected.

12. The method of claim 9, further comprising:
   determining a delay setting in between the upper delay margin and the lower delay margin;
   determining whether a difference between the upper delay margin and the lower delay margin is below a threshold;
   in response to determining that the difference is equal to or above the threshold, restoring data to the memory location; and
   in response to determining that the difference is below the threshold, maintaining a chip mark on the first DRAM, using a second DRAM instead of the first DRAM, generating a warning regarding the first DRAM, or any combination thereof.

13. A system comprising:
   a rank including a dynamic random-access memory (DRAM);
   an error correction code (ECC) decoder configured to:
      detect an error at a memory location of the DRAM; and
      in response to detecting the error, place a chip mark associated with the DRAM;
   firmware configured to:
      detect the chip mark associated with the DRAM;
      direct an access of the DRAM to the ECC decoder while the chip mark associated with the DRAM is in place; and
      request a self-test engine to perform a test of the memory location; and
   the self-test engine configured to:
      write to the rank including writing a test pattern to the memory location;
      read from the rank including reading a value from the memory location; and
      determine whether a fault is detected at the memory location based on a comparison of the value and the test pattern.

14. The system of claim 13, wherein the firmware is further configured to:
   in response to determining that the fault is not detected:
      restore data at the memory location; and
      remove the chip mark associated with the DRAM.

15. The system of claim 13, wherein the firmware is further configured to, in response to determining that the fault is detected, maintain the chip mark associated with the DRAM in place.

16. A non-transitory computer-readable medium storing instructions that, when executed by a processor, cause the processor to:

in response to receiving a test activation request indicating a memory location:
  direct an access of the memory location to an error correction code (ECC) decoder;
  write a test pattern to the memory location;
  read a value from the memory location; and
  determine whether a fault is detected at the memory location based on a comparison of the test pattern and the value.

17. The non-transitory computer-readable medium of claim 16, wherein the access is a read access or a write access.

18. The non-transitory computer-readable medium of claim 16, further comprising:
  in response to determining that the fault is not detected:
    determining an upper delay margin of a dynamic random-access memory (DRAM) associated with the memory location; and
    determining a lower delay margin of the DRAM.

19. The non-transitory computer-readable medium of claim 18, wherein determining the upper delay margin comprises successively incrementing a delay setting associated with the memory location, writing the test pattern to the memory location, and reading the value from the memory location, until after a particular increment a comparison of the test pattern and the value indicates that the fault is detected.

20. The non-transitory computer-readable medium of claim 18, wherein determining the lower delay margin comprises successively decrementing a delay setting associated with the memory location, writing the test pattern to the memory location, and reading the value from the memory location, until after a particular decrement a comparison of the test pattern and the value indicates that the fault is detected.

* * * * *